(12) United States Patent  
Litsyn et al.

(10) Patent No.: US 8,675,417 B2  
(45) Date of Patent: Mar. 18, 2014

(54) METHOD AND SYSTEM FOR ADAPTIVE CODING IN FLASH MEMORIES

(75) Inventors: Simon Litsyn, Giv'at Shmuel (IL); Eran Sharon, Rishon Lezion (IL); Idan Alrod, Herzliya (IL); Menahem Lasser, Kohav Yair (IL)

(73) Assignee: Ramot at Tel Aviv University Ltd., Tel Aviv (IL)

( * ) Notice: Subject to any disclaimer, the term of this patent is extended or adjusted under 35 U.S.C. 154(b) by 1165 days.

(21) Appl. No.: 12/567,771

(22) Filed: Sep. 27, 2009

(65) Prior Publication Data

US 2010/0082885 A1    Apr. 1, 2010

Related U.S. Application Data

(60) Provisional application No. 61/100,732, filed on Sep. 28, 2008.

(51) Int. Cl.  
*G11C 11/34* (2006.01)

(52) U.S. Cl.  
USPC ............................. 365/185.24; 365/185.11

(58) Field of Classification Search  
USPC ........................................ 365/185.24, 185.11  
See application file for complete search history.

(56) References Cited

U.S. PATENT DOCUMENTS

| | | | |
|---|---|---|---|
| 5,270,979 A | 12/1993 | Harari et al. | |
| 5,837,986 A | 11/1998 | Barile et al. | |
| 6,175,893 B1 | 1/2001 | D'Souza et al. | |
| 6,188,793 B1 | 2/2001 | Kimura et al. | |
| 6,263,312 B1 | 7/2001 | Kolesnik et al. | |
| 6,377,706 B1 | 4/2002 | de Queiroz | |
| 6,469,931 B1 | 10/2002 | Ban et al. | |
| 6,522,580 B2 | 2/2003 | Chen et al. | |
| 6,636,641 B1 | 10/2003 | Kimura et al. | |

(Continued)

FOREIGN PATENT DOCUMENTS

| AU | 2003245740 A1 | 1/2004 |
|---|---|---|
| AU | 2003297277 A1 | 6/2004 |

(Continued)

OTHER PUBLICATIONS

Uri Erez, Shlomo Shamai (Shitz), Fellow, IEEE, and Ram Zamir, "Capacity and Lattice Strategies for Canceling Known Interference", IEEE Transactions on Information Theory, vol. 51, No. 11, Nov. 2005, pp. 3820-3833.

(Continued)

*Primary Examiner* — Son Dinh  
(74) *Attorney, Agent, or Firm* — Alston & Bird LLP

(57) ABSTRACT

Bits are stored by attempting to set parameter value(s) of (a) cell(s) to represent some of the bits. In accordance with the attempt, an adaptive mapping of the bits to value ranges is provided and the value(s) is/are adjusted accordingly as needed. Or, to store (a) bit(s) in (a) cell(s), a default mapping of the bit(s) to a predetermined set of value ranges is provided and an attempt is made to set the cell value(s) accordingly. If, for one of the cells, the attempt sets the value such that the desired range is inaccessible, an adaptive mapping is provided such that the desired range is accessible. Or, to store (a) bit(s) in (a) cell(s), several mappings of the bit(s) to a predetermined set of ranges is provided. Responsive to an attempt to set the cell value(s) according to one of the mappings, the mapping to actually use is selected.

33 Claims, 5 Drawing Sheets

(56) References Cited

U.S. PATENT DOCUMENTS

| | | |
|---|---|---|
| 6,637,011 B1 | 10/2003 | Zolotykh et al. |
| 6,684,289 B1 | 1/2004 | Gonzalez et al. |
| 6,701,408 B2 | 3/2004 | Egner et al. |
| 6,727,847 B2 | 4/2004 | Rabinowitz et al. |
| 6,744,925 B2 | 6/2004 | Kimura et al. |
| 6,754,393 B2 | 6/2004 | Matoba et al. |
| 6,903,669 B1 | 6/2005 | Subramaniam |
| 6,915,020 B2 | 7/2005 | Damera-Venkata et al. |
| 6,928,287 B2 | 8/2005 | Trott et al. |
| 6,941,505 B2 | 9/2005 | Yada et al. |
| 7,012,963 B2 | 3/2006 | Zdepski et al. |
| 7,106,788 B1 | 9/2006 | Mueller et al. |
| 7,164,726 B1 | 1/2007 | Trott |
| 7,164,739 B1 | 1/2007 | Trott |
| 7,177,974 B2 | 2/2007 | Egner et al. |
| 7,196,928 B2 | 3/2007 | Chen |
| 7,199,735 B1 | 4/2007 | Wen et al. |
| 7,237,074 B2 | 6/2007 | Guterman et al. |
| 7,281,771 B1 | 10/2007 | Wen et al. |
| 7,292,647 B1 | 11/2007 | Giannakis et al. |
| 7,295,566 B1 * | 11/2007 | Chiu et al. .................. 370/419 |
| 7,327,287 B2 | 2/2008 | Martinian et al. |
| 7,348,903 B2 | 3/2008 | Lee et al. |
| 7,383,375 B2 | 6/2008 | Sinclair |
| 7,388,781 B2 | 6/2008 | Litsyn et al. |
| 7,430,246 B1 | 9/2008 | Trott |
| 7,433,347 B1 | 10/2008 | Trott et al. |
| 7,529,142 B2 | 5/2009 | Widdershoven |
| 7,533,328 B2 | 5/2009 | Alrod et al. |
| 7,545,293 B2 | 6/2009 | Reznik |
| 7,558,109 B2 * | 7/2009 | Brandman et al. ....... 365/185.03 |
| 7,565,478 B2 | 7/2009 | Bennett et al. |
| 7,631,138 B2 | 12/2009 | Gonzalez et al. |
| 7,716,415 B2 | 5/2010 | Sharon |
| 7,885,107 B2 | 2/2011 | Park et al. |
| 8,269,498 B2 | 9/2012 | Zhang |
| 8,301,826 B2 | 10/2012 | Gonzalez et al. |
| 2002/0032891 A1 | 3/2002 | Yada et al. |
| 2002/0037111 A1 | 3/2002 | Kimura et al. |
| 2002/0087784 A1 | 7/2002 | Egner et al. |
| 2002/0136068 A1 | 9/2002 | Widdershoven |
| 2003/0112471 A1 | 6/2003 | Damera-Venkata et al. |
| 2003/0194140 A1 | 10/2003 | Kimura et al. |
| 2003/0201932 A1 | 10/2003 | Rabinowitz et al. |
| 2004/0096002 A1 | 5/2004 | Zdepski et al. |
| 2004/0132454 A1 | 7/2004 | Trott et al. |
| 2004/0141358 A1 | 7/2004 | Egner et al. |
| 2004/0255090 A1 | 12/2004 | Guterman et al. |
| 2005/0147131 A1 | 7/2005 | Greer |
| 2005/0281113 A1 | 12/2005 | Yada et al. |
| 2006/0170571 A1 | 8/2006 | Martinian et al. |
| 2007/0069926 A1 | 3/2007 | Lee et al. |
| 2007/0094580 A1 | 4/2007 | Livshitz |
| 2007/0208986 A1 | 9/2007 | Luo et al. |
| 2007/0253496 A1 | 11/2007 | Giannakis et al. |
| 2008/0010581 A1 | 1/2008 | Alrod et al. |
| 2008/0065971 A1 | 3/2008 | Betts |
| 2008/0111721 A1 | 5/2008 | Reznik |
| 2008/0111722 A1 | 5/2008 | Reznik |
| 2008/0148115 A1 | 6/2008 | Sokolov |
| 2008/0151618 A1 | 6/2008 | Sharon et al. |
| 2008/0158948 A1 | 7/2008 | Sharon et al. |
| 2008/0240031 A1 | 10/2008 | Nassiri-Toussi et al. |
| 2008/0240596 A1 | 10/2008 | Haque et al. |
| 2008/0316070 A1 | 12/2008 | Van Acht et al. |
| 2009/0028128 A1 | 1/2009 | Trott et al. |
| 2009/0037791 A1 | 2/2009 | Pavlov et al. |
| 2009/0080263 A1 | 3/2009 | Lee et al. |
| 2009/0086842 A1 | 4/2009 | Shi et al. |

FOREIGN PATENT DOCUMENTS

| | | |
|---|---|---|
| EP | 1 346 370 A1 | 9/2003 |
| EP | 1 456 812 A1 | 9/2004 |
| WO | WO 01/37503 A2 | 5/2001 |
| WO | WO 02/49041 A1 | 6/2002 |
| WO | WO 02/50840 A2 | 6/2002 |
| WO | WO 02/054410 A1 | 7/2002 |
| WO | WO 03/043323 A1 | 5/2003 |
| WO | WO 03/054786 A1 | 7/2003 |
| WO | WO 2004/004405 A1 | 1/2004 |
| WO | WO 2004/047062 A2 | 6/2004 |
| WO | WO 2005/065014 A2 | 7/2005 |
| WO | WO 2006/013496 A1 | 2/2006 |
| WO | WO 2006/062993 A2 | 6/2006 |
| WO | WO 2007/035070 A1 | 3/2007 |
| WO | WO 2007/092816 A2 | 8/2007 |
| WO | WO 2007/114724 A1 | 10/2007 |
| WO | WO 2007/119190 A2 | 10/2007 |
| WO | WO2007/132452 | 11/2007 |
| WO | WO 2008/004226 A2 | 1/2008 |
| WO | WO2008019347 | 2/2008 |
| WO | WO 2008/061008 A2 | 5/2008 |
| WO | WO 2008/061143 A2 | 5/2008 |
| WO | WO 2008/118474 A2 | 10/2008 |
| WO | WO 2009/040775 A2 | 4/2009 |
| WO | WO 2009/045910 A2 | 4/2009 |
| WO | WO 2009/072103 A2 | 6/2009 |

OTHER PUBLICATIONS

Jay Grossman, "Coding Theory: Introduction to Linear Codes and Applications", InSight: River Academic Journal vol. 4, No. 2, Fall 2008, pp. 1-17.

International Search Report/Written Opinion for Application No. PCT/IB2009/054222 dated Jan. 7, 2010.

International Preliminary Report on Patentability for Application No. PCT/IB2009/054222 dated Mar. 29, 2011.

Office Action for European Application No. EP 09 787 308.7 dated Mar. 23, 2012.

Costa, M., *Writing on dirty paper* (*corresp.*), IEEE Transactions on Information Theory, vol. 29, Issue 3 (May 1983) 439-441.

United States Office Action for U.S. Appl. No. 13/311,599, dated Jul. 3, 2013.

* cited by examiner

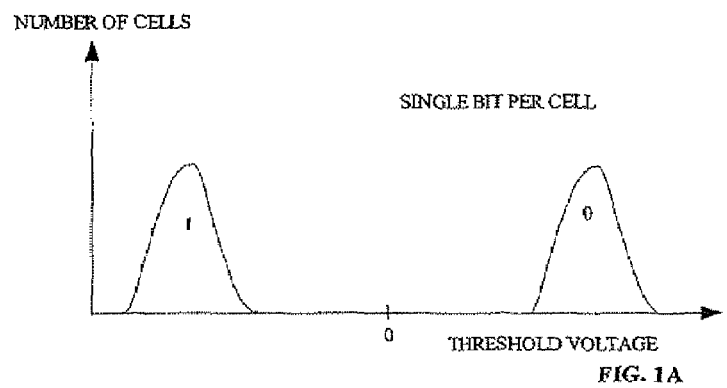
FIG. 1A
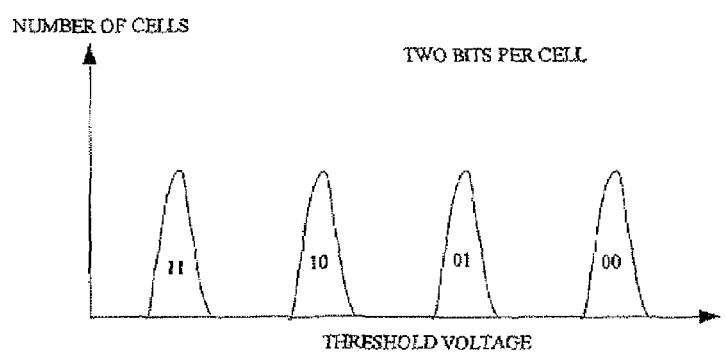
FIG. 1B
FIG. 1
PRIOR ART

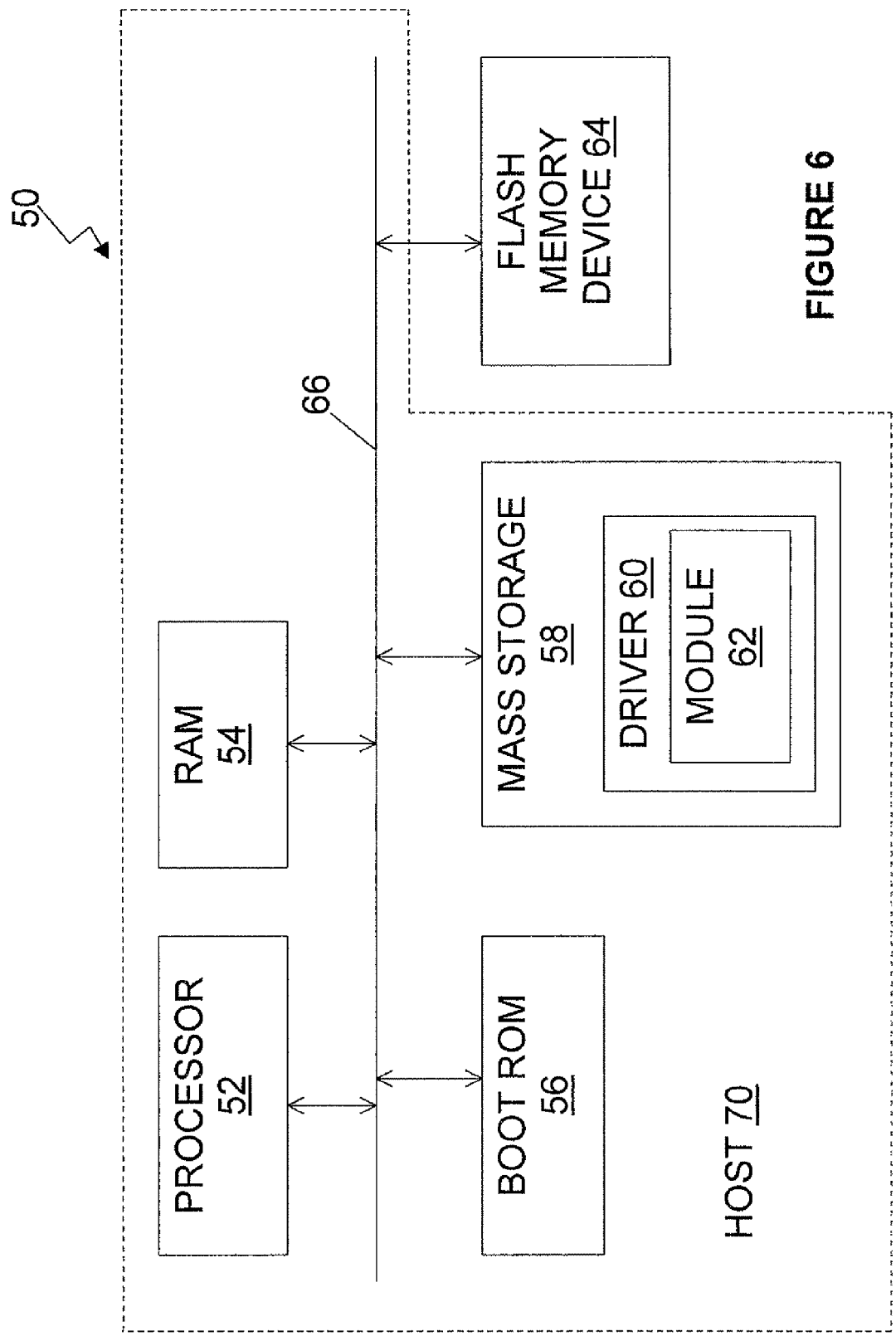

METHOD AND SYSTEM FOR ADAPTIVE CODING IN FLASH MEMORIES

This patent application claims the benefit of U.S. Provisional Patent Application No. 61/100,732, filed Sep. 28, 2008

FIELD AND BACKGROUND OF THE INVENTION

The present invention relates to storing data in computer memories such as flash memories and, more particularly, to a method of storing data in a computer memory in a manner that enables the cells that store the data to include a small number of "bad" cells.

Flash memory devices have been known for many years. Typically, each memory cell within a flash memory stores one bit of information. The traditional way to store a bit in a flash memory cell has been by supporting two states of the cell. One state represents a logical "0" and the other state represents a logical "1". In a flash memory cell, the two states are implemented by having a floating gate above the cell's channel (the area connecting the source and drain elements of the cell's transistor), and having two valid states for the amount of charge stored within the floating gate. Typically, one state is with zero charge in the floating gate and is the unwritten state of the cell after being erased (commonly defined to represent the "1" state) and the other state is with some amount of negative charge in the floating gate (commonly defined to represent the "0" state). Negative charge is imposed on the floating gate by applying voltage pulses to the cell to inject electrons from the cell's silicon substrate through the cell's oxide layer into the floating gate until the threshold voltage is high enough to represent the "0" state. Having negative charge in the gate causes the threshold voltage of the cell's transistor (i.e. the voltage that has to be applied to the transistor's control gate in order to cause the transistor to conduct) to increase. It is possible to read the stored bit by checking the threshold voltage of the cell. If the threshold voltage is in the higher state then the bit value is "0" and if the threshold voltage is in the lower state then the bit value is "1". Actually there is no need to accurately read the cell's threshold voltage. All that is needed is to correctly identify in which of the two states the cell is currently located. For this purpose it is sufficient to compare the threshold voltage of the cell to a reference voltage that is between the two states, and to determine if the cell's threshold voltage is below or above the reference value.

FIG. 1A (prior art) shows graphically how this works. Specifically, FIG. 1A shows a distribution of the threshold voltages of a large population of cells. Because the cells in a flash device are not exactly identical in their characteristics and behavior (due to, for example, small variations in impurity concentrations or defects in the silicon structure), applying the same writing operation to all the cells does not cause all the cells to have exactly the same threshold voltage. Instead, the threshold voltage is distributed as shown in FIG. 1A. Cells storing a value of "1" typically have a negative threshold voltage, such that most of the cells have a threshold voltage close to the central voltage value of the left peak (labeled 1) of FIG. 1A, with fewer cells having threshold voltages lower or higher than the central voltage of the left peak. Similarly, cells storing a value of "0" typically have a positive threshold voltage, such that most of the cells have a threshold voltage close to the central voltage of the right peak (labeled 0) of FIG. 1A, with fewer cells having threshold voltages lower or higher than the central voltage of the right peak.

For historical reasons, writing data to a flash memory cell also is called "programming" the flash cell. The terms "writing" and "programming" are used interchangeably herein.

In recent years, a new kind of flash device has appeared on the market, using "Multi Level Cells" (MLC). The term "Multi-Level Cell" is misleading because flash memory with a single bit per cell uses multiple i.e. two levels, as described above. Therefore, the term "Single Bit Cell" (SBC) is used hereinafter to refer to a memory cell of two levels and the term "Multi-Bit Cell" (MBC) is used hereinafter to refer to a memory cell of more than two levels, i.e. more than one bit per cell. The technology presented herein is described with reference to an MBC flash memory with two bits per cell. It should however be understood that the technology presented herein is equally applicable to flash memory devices that support more than two bits per cell.

A single MBC cell storing two bits of information is in one of four different states. As the cell's "state" is represented by the cell's threshold voltage, an MBC cell supports four different valid ranges for the cell's threshold voltage. FIG. 1B (prior art) shows the threshold voltage distribution for a typical MBC cell of two bits per cell. As expected, FIG. 1B has four peaks, each peak corresponding to one state. As for the SBC, each state is actually a voltage range and not a single voltage. When reading the cell's contents, the cell's threshold voltage must be correctly identified in a definite voltage range.

The programming of a MBC flash cell is not foolproof. Consider, for example, how the ten binary numbers 11, 01, 11, 01, 11, 00, 10, 00, 10, 00 might be stored in ten MBC cells. The mapping of threshold voltages to bit patterns is as illustrated in FIG. 1B:

| State Number | Threshold voltage band | Bit pattern |
| --- | --- | --- |
| 0 | <0 V | 11 |
| 1 | Between 0 V and 1 V | 10 |
| 2 | Between 1 V and 2 V | 01 |
| 3 | >2 V | 00 |

The most significant bits (1010101010) are stored by programming the second, fourth, sixth, eighth and tenth cells into the 1V-2V threshold voltage band. The least significant bits (1111100000) then are stored by programming the sixth, eight and tenth cells into the >2V threshold voltage band and by programming the seventh and ninth cells into the 0V-1V threshold voltage band. Physical effects, such as programming variations, program disturb and cross coupling, during the programming of the most significant bits and between the programming of the most significant bits and the programming of the least significant bits, might cause e.g. the second cell to be placed inadvertently in the >2V band before the least significant bits are programmed, thereby making it impossible for the second cell to store the desired "01" bit pattern without erasing the cell and starting over, because programming operations only increase the threshold voltage of a cell. But flash memory cells are erased a full block of cells at a time and it is not practical to erase a full block of cells merely for correcting an error in a small number of cells.

This kind of error, in which a flash memory cell is placed in an intermediate state, during programming, from which the desired final state of the cell cannot be reached by further programming without erasing the cell, is referred to herein as "overprogramming" the cell. A cell that has experienced such overprogramming is referred to herein as an "overprogrammed" cell.

Overprogramming is not the only reason that the programming of an MBC flash cell is not foolproof. After the wear and tear of many programming and erasure cycles, a flash cell may be stuck permanently in one of its threshold voltage states. For example, the condition of a cell in its erase state (storing "11" according to the table above) may be such that no amount of programming can budge the cell from the erase state, or the condition of a cell in its most programmed state (storing "00" according to the table above) may be such that no amount of erasing can budge the cell from the most programmed state.

Conventionally, problems of this kind are handled by encoding the data to be stored as codewords that are stored instead of the data, and hoping that the encoding is strong enough to overcome both these programming errors and subsequent errors such as drift of the threshold voltages over time.

Tutorial on $GF(2^{t+1})$

One of the methods described below is based on the Galois field $GF(2^{t+1})$.

$GF(2^{t+1})$ is a set of $2^{t+1}$ elements with well defined operations of summation, multiplication and division. The elements in the field can be represented as binary vectors of length t+1 Alternatively, the field elements can be represented as binary polynomials of degree at most t with well-defined operations of summation, multiplication and division.

Each element of $GF(2^{t+1})$ is associated with a vector of t+1 coordinates and with a polynomial of degree at most t over GF(2) in the following manner:

$$a=(a_0, a_1, \ldots, a_t) \leftrightarrow p_a(x) = a_0 + a_1 x + \ldots + a_t x^t$$

The coefficients of the polynomial $p_a(x)$ are elements in GF(2) (i.e., either 0 or 1) and summation of $p_a(x)$ and $p_b(x)$ is defined as:

$$p_a(x) + p_b(x) = \sum_{j=0}^{t} (a_j \oplus b_j) \cdot x^j \mid a_b \oplus b_j = a + b_{modulo\ 2}$$

Multiplication of two elements, a,b is done by multiplication of the associated polynomials $p_a(x)$, $p_b(x)$ and taking the result modulo a predefined irreducible polynomial g(x) of degree t+1 over GF(2). The multiplication result a·b can be represented as a binary vector of length t+1 over GF(2), where each coordinate is a binary linear combination of elements (coefficients) of a and elements (coefficients) of b.

To complete the picture, the inverse and the division operation are defined. Each non-zero element a of $GF(2^{t+1})$ has a unique inverse element denoted $a^{-1}$, such that $a \cdot a^{-1} = a^{-1} \cdot a = 1$. Division by a is equivalent to multiplication by $a^{-1}$.

SUMMARY OF THE INVENTION

According to preferred embodiments of the methodology described herein, multiple codewords are associated with vectors of information bits to be programmed to a flash memory.

When programming the flash memory, each programmed codeword in based on the status of the flash memory prior to the programming operation and not only on the information to be programmed to the flash memory. Before programming the flash memory (or before the final programming in the case of several programming operations), the cells to be programmed are read and cells that already carry a high threshold voltage level are marked as defective cells or cells for which the voltage cannot be changed. Next, a codeword is chosen from a set of multiple codewords associated with the vector of information bits that are to be programmed to the flash cells, subject to the restriction of which cells have unchangeable threshold voltages. The chosen codeword contains 0 in all or most coordinates that are associated with the defective cells (assuming that 0 is associated with a higher voltage level than 1). The chosen codeword then is programmed to the flash memory.

Therefore, one embodiment provided herein is a method of storing a plurality of bits, including: (a) attempting to set a respective value of a physical parameter of each of at least one memory cell so that the at least one value of the physical parameter of the at least one memory cell represents an initial portion of the bits; (b) providing, in accordance with the at least one value to which the physical parameter of the at least one cell has been set, an adaptive mapping of the bits to physical parameter value ranges for storing all of the bits in the at least one memory cell; and (c) for each of the at least one memory cell, if, according to the adaptive mapping, the respective value of the physical parameter of the each memory cell needs to be adjusted in order for all of the bits to be stored in the at least one memory cell: adjusting the respective value of the physical parameter of the each memory cell in accordance with the adaptive mapping.

Another embodiment provided herein is a method of storing at least one bit, including: (a) providing a default mapping of the at least one bit to a predetermined set of ranges of values of a physical parameter of at least one memory cell; (b) attempting to set a respective value of the physical parameter of each memory cell of the at least one memory cell so that the at least one bit is stored in the at least one memory cell in accordance with the default mapping; and (c) if the attempting sets the respective value of the physical parameter of one of the at least one memory cell to a value from which a range of physical parameter values, of the one memory cell, that corresponds to the at least one bit according to the default mapping, is inaccessible: providing an adaptive mapping, of the at least one bit to the predetermined set of ranges of the values of the physical parameter, for storing the at least one bit in the at least one memory cell, such that the range of physical parameter values of the one memory cell that corresponds to the at least one bit according to the adaptive mapping is accessible.

Another embodiment provided herein is a method of storing at least one bit, including: (a) providing a plurality of mappings of the at least one bit to a predetermined set of ranges of values of a physical parameter of at least one memory cell; (b) attempting to set a respective value of the physical parameter of each memory cell of the at least one memory cell so that the at least one bit is stored in the at least one memory cell in accordance with a first one of the mappings; and (c) responsive to an outcome of the attempting: selecting one of the mappings to actually use for storing the at least one bit in the at least one memory cell.

Another embodiment provided herein is a controller, for storing a plurality of bits in a memory that includes at least one memory cell, the controller being operative: (a) to attempt to set a respective value of a physical parameter of each of the at least one memory cell so that the at least one value of the physical parameter of the at least one memory cell represents an initial portion of the bits; (b) to provide, in accordance with the at least one value to which the physical parameter of the at least one cell has been set, an adaptive mapping of the bits to physical parameter value ranges for storing all of the bits in the at least one memory cell; and (c) for each of the at least one memory cell: to adjust the respective value of the physical parameter of the each memory cell in accordance with the adaptive mapping if, according to the adaptive mapping, the respective value of the physical parameter of the each memory cell needs to be adjusted in order for all the bits to be stored in the at least one memory cell.

Another embodiment provided herein is a controller, for storing at least one bit in a memory that includes at least one memory cell, the controller being operative: (a) to attempt to set a respective value of a physical parameter of each memory cell of the at least one memory cell so that the at least one bit is stored in the at least one memory cell in accordance with a default mapping of the at least one bit to a predetermined set of ranges of values of the physical parameter; and (b) if the attempting sets the respective value of the physical parameter of one of the at least one memory cell to a value from which a range of physical parameter values, of the one memory cell, that corresponds to the at least one bit according to the default mapping, is inaccessible: to provide an adaptive mapping, of the at least one bit to the predetermined set of ranges of the values of the physical parameter, for storing the at least one bit in the at least one memory cell, such that the range of physical parameter values of the one memory cell that corresponds to the at least one bit according to the adaptive mapping is accessible.

Another embodiment provided herein is a controller, for storing at least one bit in a memory that includes at least one memory cell, the controller being operative: (a) to provide a plurality of mappings of the at least one bit to a predetermined set of ranges of values of a physical parameter of the at least one memory cell; (b) to attempt to set a respective value of the physical parameter of each memory cell of the at least one memory cell so that the at least one bit is stored in the at least one memory cell in accordance with a first one of the mappings; and (c) responsive to the outcome of the attempting: to select one of the mappings to actually use for storing the at least one bit in the at least one memory cell.

Another embodiment provided herein is a memory device including: (a) a memory including at least one memory cell; and (b) a controller operative: (i) to attempt to set a respective value of a physical parameter of each of the at least one memory cell so that the at least one value of the physical parameter of the at least one memory cell represents an initial portion of a plurality of bits, (ii) to provide, in accordance with the at least one value to which the physical parameter of the at least one cell has been set, an adaptive mapping of the bits to physical parameter value ranges for storing all of the bits in the at least one memory cell, and (iii) for each of the at least one memory cell: to adjust the respective value of the physical parameter of the each memory cell in accordance with the adaptive mapping if, according to the adaptive mapping, the respective value of the physical parameter of the each memory cell needs to be adjusted in order for all the bits to be stored in the at least one memory cell.

Another embodiment provided herein is a memory device including: (a) a memory including at least one memory cell; and (b) a controller operative: (i) to attempt to set a respective value of a physical parameter of each memory cell of the at least one memory cell so that the at least one bit is stored in the at least one memory cell in accordance with a default mapping of the at least one bit to a predetermined set of ranges of values of the physical parameter, and (ii) if the attempting sets the respective value of the physical parameter of one of the at least one memory cell to a value from which a range of physical parameter values, of the one memory cell, that corresponds to the at least one bit according to the default mapping, is inaccessible: to provide an adaptive mapping, of the at least one bit to the predetermined set of ranges of the values of the physical parameter, for storing the at least one bit in the at least one memory cell, such that the range of physical parameter values of the one memory cell that corresponds to the at least one bit according to the adaptive mapping is accessible.

Another embodiment provided herein is a memory device including: (a) a memory including at least one memory cell; and (b) a controller operative: (i) to provide a plurality of mappings of at least one bit to a predetermined set of ranges of values of a physical parameter of the at least one memory cell, (ii) to attempt to set a respective value of the physical parameter of each memory cell of the at least one memory cell so that the at least one bit is stored in the at least one memory cell in accordance with a first one of the mappings, and (iii) responsive to the outcome of the attempting: to select one of the mappings to actually use for storing the at least one bit in the at least one memory cell.

Another embodiment provided herein is a system including: (a) a first memory, including at least one memory cell, for storing a plurality of bits; and (b) a host, of the first memory, including: (i) a second memory for storing code for managing the first memory by: (A) attempting to set a respective value of a physical parameter of each of the at least one memory cell so that the at least one value of the physical parameter of the at least one memory cell represents an initial portion of the bits, (B) providing, in accordance with the at least one value to which the physical parameter of the at least one cell has been set, an adaptive mapping of the bits to physical parameter value ranges for storing all of the bits in the at least one memory cell, and (C) for each of the at least one memory cell, if, according to the adaptive mapping, the respective value of the physical parameter of the each memory cell needs to be adjusted in order for all of the bits to be stored in the at least one memory cell: adjusting the respective value of the physical cal parameter of the each memory cell in accordance with the adaptive mapping, and (ii) a processor for executing the code.

Another embodiment provided herein is a system including: (a) a first memory, including at least one memory cell, for storing at least one bit; and (b) a host, of the first memory, including: (i) a second memory for storing code for managing the first memory by: (A) providing a default mapping of the at least one bit to a predetermined set of ranges of values of a physical parameter of the at least one memory cell, (B) attempting to set a respective value of the physical parameter of each memory cell of the at least one memory cell so that the at least one bit is stored in the at least one memory cell in accordance with the default mapping, and (C) if the attempting sets the respective value of the physical parameter of one of the at least one memory cell to a value from which a range of physical parameter values, of the one memory cell, that corresponds to the at least one bit according to the default mapping, is inaccessible: providing an adaptive mapping, of the at least one bit to the predetermined set of ranges of the values of the physical parameter, for storing the at least one bit in the at least one memory cell, such that the range of physical parameter values of the one memory cell that corresponds to the at least one bit according to the adaptive mapping is accessible, and (ii) a processor for executing the code.

Another embodiment provided herein is a system including: (a) a first memory, including at least one memory cell, for storing at least one bit; and (b) a host, of the first memory, including: (i) a second memory for storing code for managing the first memory by: (A) providing a plurality of mappings of the at least one bit to a predetermined set of ranges of values of a physical parameter of the at least one memory cell, (B) attempting to set a respective value of the physical parameter of each memory cell of the at least one memory cell so that the at least one bit is stored in the at least one memory cell in accordance with a first one of the mappings, and (C) responsive to an outcome of the attempting: selecting one of the mappings to actually use for storing the at least one bit in the at least one memory cell, and (ii) a processor for executing the code.

Another embodiment provided herein is a computer-readable storage medium having embedded thereon computer-readable code for storing a plurality of bits in a memory that includes at least one memory cell, the computer-readable code including: (a) program code for attempting to set a respective value of a physical parameter of each of the at least one memory cell so that the at least one value of the physical parameter of the at least one memory cell represents an initial portion of the bits; (b) program code for providing, in accordance with the at least one value to which the physical parameter of the at least one cell has been set, an adaptive mapping of the bits to physical parameter value ranges for storing all of the bits in the at least one memory cell; and (c) program code for: for each of the at least one memory cell, if, according to the adaptive mapping, the respective value of the physical parameter of the each memory cell needs to be adjusted in order for all of the bits to be stored in the at least one memory cell: adjusting the respective value of the physical parameter of the each memory cell in accordance with the adaptive mapping.

Another embodiment provided herein is a computer-readable storage medium having embedded thereon computer-readable code for storing at least one bit in a memory that includes at least one memory cell, the computer-readable code including: (a) program code for providing a default mapping of the at least one bit to a predetermined set of ranges of values of a physical parameter of the at least one memory cell; (b) program code for attempting to set a respective value of the physical parameter of each memory cell of the at least one memory cell so that the at least one bit is stored in the at least one memory cell in accordance with the default mapping; and (c) program code for: if the attempting sets the respective value of the physical parameter of one of the at least one memory cell to a value from which a range of physical parameter values, of the one memory cell, that corresponds to the at least one bit according to the default mapping, is inaccessible: providing an adaptive mapping, of the at least one bit to the predetermined set of ranges of the values of the physical parameter, for storing the at least one bit in the at least one memory cell, such that the range of physical parameter values of the one memory cell that corresponds to the at least one bit according to the adaptive mapping is accessible.

Another embodiment provided herein is a computer-readable storage medium having embedded thereon computer-readable code for storing at least one bit in a memory that includes at least one memory cell, the computer-readable code including: (a) program code for providing a plurality of mappings of the at least one bit to a predetermined set of ranges of values of a physical parameter of the at least one memory cell; (b) program code for attempting to set a respective value of the physical parameter of each memory cell of the at least one memory cell so that the at least one bit is stored in the at least one memory cell in accordance with a first one of the mappings; and (c) program code for: responsive to an outcome of the attempting: selecting one of the mappings to actually use for storing the at least one bit in the at least one memory cell.

The first method disclosed herein is a method of storing a plurality of bits. In the first step of the most general embodiment of this method, an attempt is made to set a respective value of a physical parameter, such as a threshold voltage, of each of one or more memory cells so that the value(s) of the physical parameter represent(s) an initial portion of the bits. At this stage, the value(s) of the physical parameter need not represent all the bits. It is also possible, e.g. if a plurality of cells is being programmed and one of the cells is defective for the reasons described above (frozen in its erase state or in its most programmed state), that the attempt to represent only a portion of the bits may fail; this is why this step is only an "attempt". In accordance with the value(s) of the physical parameter achieved in the first step, an adaptive mapping of the bits to physical parameter value ranges is provided for storing all the bits in the memory cell(s). This mapping is "adaptive" because it may change from one bit storage session to another, depending on the outcome of the first step. For each memory cell, if, according to the adaptive mapping, the cell's respective value of the physical parameter needs to be adjusted in order for all the bits to be stored in the memory cell(s), then the memory cell's respective value is adjusted in accordance with the adaptive mapping.

Preferably, the first step attempts to set the value(s) of the physical parameter of the memory cell(s) so that the value(s) of the physical parameter that will ultimately represent all the bits is/are accessible from the value(s) that is/are set in the first step. By a physical parameter value being "accessible" is meant that the physical parameter can be adjusted to attain that value by programming the cell without having to erase the cell. For example, in FIG. 1B, a threshold voltage value in the (0,1) band is not accessible from the (0,0) threshold voltage band but a threshold voltage value in the (0,0) band is accessible from the (0,1) threshold voltage band.

Preferably, the first method also includes providing a default mapping, of bits to physical parameter value ranges, for storing all the bits in the cell(s) (in which case the representation of the initial portion of the bits that is attempted in the first step normally is in accordance with this default mapping). The adaptive mapping may be identical to the default mapping (e.g. if the attempt succeeds) or may be different from the default mapping (e.g. if the attempt fails and the default mapping is inconsistent with storing all the bits in the cell(s)). A typical reason for the default mapping to be inconsistent with storing all the bits in the cell(s) is that the physical parameter value range, for (one of) the cell(s), that corresponds, according to the default mapping, to bits to be stored in the cell, is inaccessible from the value to which the physical parameter has been set by the attempting step. For example, if, as in the case of the physical parameter being threshold voltage, the physical parameter value ranges are ordered from lowest to highest, the physical parameter value range that corresponds, according to the default mapping, to bits to be stored in the cell may be inaccessible by virtue of being lower than the value of the physical parameter that has been set by the attempting step.

Preferably, the providing of the adaptive mapping includes encoding at least a portion of the bits as a codeword. The adjusting of the physical parameter values that need to be adjusted then is done so that each cell stores a respective portion of the codeword.

The second method disclosed herein is a method of storing one or more bits. In the most general embodiment of this method, a default mapping is provided of the bit(s) to a predetermined set of ranges of values of a physical parameter, such as threshold voltage, of one or more memory cells. One example of such a mapping is the table presented above in connection with FIG. 1B, for each of the cells. Another example of such a mapping is the following surjective mapping of sequences of three bits to combinations of threshold voltage ranges of two cells, each of which can be placed in one of three threshold voltage ranges (labeled 0, 1 and 2):

| Bit sequence | Threshold voltage range | |
|---|---|---|
| | First cell | Second cell |
| 0 0 0 | 0 | 0 |
| 0 0 1 | 0 | 1 |
| 0 1 1 | 0 | 2 |
| 0 1 0 | 1 | 2 |
| 1 1 0 | 2 | 2 |
| 1 1 1 | 2 | 1 |
| 1 0 1 | 2 | 0 |
| 1 0 0 | 1 | 0 |

(This mapping is surjective because the (1,1) threshold voltage range combination is not used.) An attempt is made to set a respective value of the physical parameter of each cell so that the bit(s) is/are stored in the cell(s) in accordance with the default mapping. If the attempt sets the respective value of the physical parameter of (one of) the cell(s) to a value from which a range of physical parameter values of the cell, that corresponds to the bit(s) according to the default mapping, is inaccessible, then the default mapping is replaced with an adaptive mapping, of the bit(s) to the predetermined set of ranges of the physical parameter, such that the range of physical parameter values of the cell that corresponds to the bit(s) is accessible (either because the value already is in that range or because the cell can be set to that range by further programming without erasing the cell). Preferably, the respective value(s) of the physical parameter then is/are set in accordance with the adaptive mapping.

Preferably, as in the case of the physical parameter being threshold voltage, the physical parameter value ranges are ordered, and the reason that the range of physical parameter values of (one of) the cell(s) that corresponds to the bit(s) according to the default mapping is inaccessible may be that that range is lower than the respective value to which the physical parameter of the cell in question has been set by the attempting step.

Preferably, the providing of the adaptive mapping includes encoding at least a portion of the bit(s) as a codeword.

The third method disclosed herein is a method of storing one or more bits. A plurality of mappings of the bit(s) to a predetermined set of ranges of values of a physical parameter, such as threshold voltage, of one or more memory cells is provided. An attempt is made to set a respective value of the physical parameter of each memory cell so that the bit(s) are stored in the cell(s) in accordance with a first one of the mappings. Responsive to the outcome of the attempt, one of the mappings to actually use for storing the bit(s) is selected. Preferably, the respective value of the physical parameter of each memory cell then is set so that the bit(s) is/are stored in the cell(s) in accordance with the selected mapping.

The selected mapping could be the first mapping (e.g. if the attempting step succeeds) or could be a different one of the mappings (e.g. if the attempting step fails). A typical symptom of failure is that the physical parameter value range, for (one of) the cell(s), that corresponds, according to the first mapping, to bits to be stored in the cell, is inaccessible from the value to which the physical parameter has been set by the attempting step. For example, if, as in the case of the physical parameter being threshold voltage, the physical parameter value ranges are ordered from lowest to highest, the physical parameter value range that corresponds, according to the default mapping, to bits to be stored in the cell may be inaccessible by virtue of being lower than the value of the physical parameter that has been set by the attempting step.

Preferably, the selected mapping includes encoding at least a portion of the bit(s) as a codeword.

A controller, corresponding to the first disclosed method, for storing a plurality of bits in a memory that includes one or more memory cells, uses the first disclosed method to store the bits in the cell(s). A controller, corresponding to the second or third disclosed method, for storing one or more bits in a memory that includes one or more memory cells, uses the second or third method to store the bit(s) in the cell(s).

A memory device, corresponding to the first disclosed method, includes a memory with one or more memory cells, and a controller that uses the first disclosed method to store a plurality of bits in the cell(s). A memory device, corresponding to the second or third disclosed method, includes a memory with one or more cell(s), and a controller that uses the second or third disclosed method to store one or more bits in the cell(s).

A system corresponding to one of the three disclosed methods includes a first memory and a host of the first memory. The first memory includes one or more memory cells. The host includes a second memory for storing code for managing the first memory according to the relevant method and a processor for executing the code.

A computer readable storage medium corresponding to one of the three disclosed methods has embodied thereon computer-readable code for implementing the relevant method to manage a memory that includes one or more memory cells.

BRIEF DESCRIPTION OF THE DRAWINGS

Various embodiments are herein described, by way of example only, with reference to the accompanying drawings, wherein:

FIG. 1 is a prior art drawing of voltage level distributions for single bit and dual bit flash memory cells;

FIG. 6 is a high-level schematic block diagram of a system for managing a flash memory device.

DESCRIPTION OF THE PREFERRED EMBODIMENTS

Figure 2:
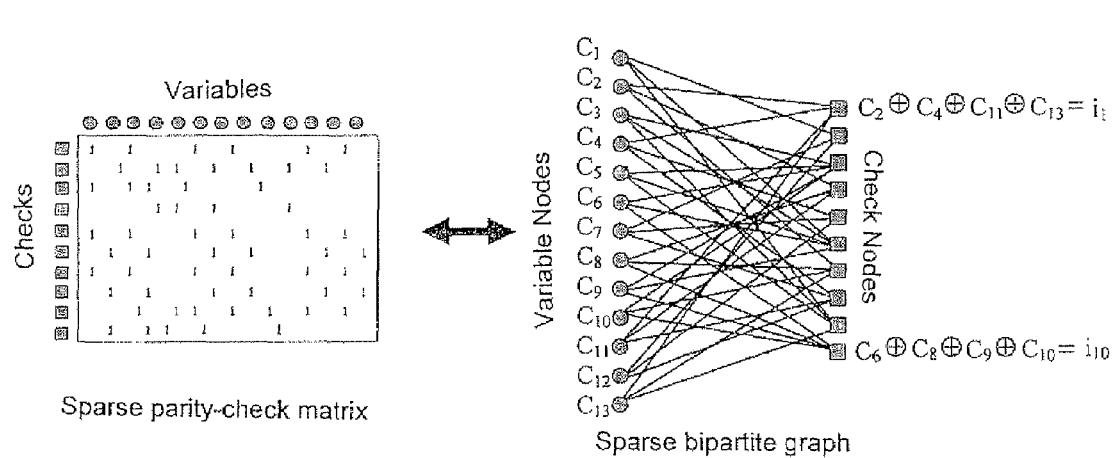
FIG. 2 shows how a code can be represented as either a sparse parity-check matrix or as a sparse bipartite graph.

The principles and operation of the programming of a memory such as a flash memory according to the present invention may be better understood with reference to the drawings and the accompanying description.

Two examples of code construction now will be described, with corresponding encoding and decoding algorithms. One code construction is suitable for "hard" feedback. The other code construction is suitable for "soft" feedback.

The described code constructions satisfy the following properties:
  Every vector of information bits is associated with multiple codewords.
  An efficient low-complexity encoding algorithm exists for the code. For a given set of "hard"/"soft" constraints on the desired codeword, the encoding algorithm allows low complexity encoding of the information vector into a codeword that satisfies all or most of the constraints as closely as possible with high probability.

An efficient low-complexity decoding algorithm exists for the code, allowing decoding of the information vector from the read codeword.

The following "hard" constraint example shows how to define multiple encodings of a vector of information bits I, with at most t coordinates of the encoded vector being constrained to 0, while adding only t+1 bits of redundancy. The encodings belong to the family of block codes that encode vectors of length k×(t+1) into vectors of length (k+1)×(t+1).

Given the information vector I of length k×(t+1) over GF(2), (i.e. each coordinate of I is 0 or 1), I is partitioned in the form $I=(v_0,v_1,\ldots v_{k-1})\in GF(2^{t+1})^k$. Each of the coordinates $v_i$ is a vector of t+1 bits and is associated with an element of $GF(2^{t+1})$ in a standard manner. The family of multiple encodings is the set:

$$\{(v_0 f, v_1 f, \ldots, v_{k-1} f, f) | f \in GF(2^{t+1}), f \neq 0\}.$$

Thus, each information vector is associated with a family of $2^{t+1}-1$ encodings.

Choosing the specific encoding with at most t bits constrained to be 0 is translated, using basic linear algebra, to a set of at most t homogeneous equations with t+1 unknown bit values constructing f. A non-trivial solution is guaranteed to exist, and can be computed by standard linear algebra methods.

Specifically, fixing an element $v_i \in GF(2^{t+1})$, $v_i=(v_{i0}, v_{i1}, \ldots, v_{it})$, and considering the multiplication of $f \in GF(2^{t+1})$ by $v_i$, the result is a binary vector where each coordinate is a linear combination of the coordinates of f. Thus, constraining any coordinate of the result to be 0 is equivalent to solving a linear equation where the unknowns are the coordinates of f, and the coefficients are the coordinates of $v_i$.

For example: set:

$$t=3, g(x)=1+x+x^4$$

$$a=(a_0,a_1,a_2,a_3), b=(b_0,b_1,b_2,b_3)$$

$$ab=(a_0b_0+a_3b_1+a_2b_2+a_1b_3, a_1b_0+(a_0+a_3)b_1+(a_2+a_3)b_2+(a_1+a_2)b_3, a_2b_0+a_1b_1+(a_0+a_3)b_2+(a_2+a_3)b_3, a_3b_0+a_2b_1+a_1b_2+(a_0+a_3)b_3)$$

For a=(0,1,0,1) we get:

$$ab=(b_1+b_3, b_0+b_1+b_2+b_3, b_1+b_2+b_3, b_0+b_2+b_3)$$

For example constraining the least significant bit of the result to 0 is done by solving: $b_1+b_3=0$.

Consider, then, the following example. The memory is a NAND flash memory. Each word line has 528 cells: 512 cells for storing data and 16 cells for storing overhead information. The threshold voltage bands and corresponding bit patterns are as in the table presented above in connection with FIG. 1B:

Before the word line is programmed, all the cells' threshold voltages are in the lowest threshold voltage band. The cells are to be programmed to store two logical pages. The first logical page is 512 information bits to be stored as the most significant bits in the first 512 cells. First the most significant information bits are programmed, by applying programming voltage pulses to the cells that are supposed to store "0" most significant bits until the threshold voltages of those cells are greater than 1V. The programming of the first logical page is not supposed to put any of the threshold voltages into the fourth threshold band (>2V), but, as discussed above it might happen that a small number of cells get overprogrammed into this threshold voltage band. Therefore, the information bits of the second logical page are encoded as a codeword whose bits are zero bits in the overprogrammed cells. The word line is read to find out which cells have been overprogrammed.

For definiteness, suppose that the codeword can accommodate up to three overprogrammed cells (t=3). That means that each coordinate $v_i$ is a vector of four bits. So k=128: $v_0$ is the first four information bits of the second logical page; $v_{127}$ is the last four information bits of the second logical page; Two out of the 16 overhead cells will be used for storing the 4 bits representing f. With four bits in f and f≠0 that means that there are fifteen ($2^4-1$) codewords to choose from. Which of the code words is suitable depends on how many overprogrammed cells there are and on which cells are overprogrammed. If there are no overprogrammed cells, any one of the fifteen codewords is suitable. If there is one overprogrammed cells, seven ($2^3-1$) of the fifteen codewords are suitable. If there are two overprogrammed cells, three ($2^2-1$) (and possibly more) of the fifteen codewords are suitable. If there are three overprogrammed cells, one ($2^1-1$) (and possibly more) of the fifteen codewords is suitable.

To be even more definite, suppose that the three overprogrammed cells are cells 25, 50 and 75. That means that in the codeword, the first bit of $v_6 f$, the second bit of $v_{12} f$ and the third bit of $v_{18} f$ must be zero. Those three conditions plus the constraint that f≠0 is sufficient to determine f by standard linear algebra methods.

The above example of $GF(2^{t+1})$ multiplication maps into the present example if $v_6=a=(0,1,0,1)$ and b=f. Then if $f=(f_1, f_2, f_3, f_4)$ the constraint "first bit of $v_6 f$ must be zero" becomes $f_1+f_3=0$.

Based on the 3 constraints f is computed. The resulting codeword is $(v_0 f, \ldots, v_{127} f, f)$. The bits $v_0 f, \ldots, v_{127} f$ are stored in the least significant bits of the first 512 cells. The bits of f can be stored in the first two overhead cells. This encoding procedure is aimed at handling errors that were introduced during the programming (e.g. the overprogramming of cells 25, 50 and 75) and as such are known during the encoding. However, additional errors may be introduced after programming, e.g. due to threshold voltage drift over time. In order to handle these errors an additional Error Correction Code (ECC) needs to be used. The ECC encoder encodes the resulting codeword $(v_0 f, \ldots, v_{127} f, f)$ of the first encoding stage, adding a second set of overhead bits. These overhead bits can be stored in the remaining 528−512−2=14 cells of the word line.

During reading of the word line, first an ECC decoder is used in order to recover the data stored the first 514 cells using the overhead stored in the last 14 cells. Assuming the ECC successfully recovered the data (the ECC is designed to succeed with high probability) then the recovered data in the least significant bits of the first 512 cells and the bits of the first 2 overhead cells, denoted as $(w_0, \ldots w_{128})$, is equal to $(v_0 f, \ldots, v_{127} f, f)$. Then, a second decoding stage is done in order to recover the second logical page $(v_0, \ldots, v_{127})$. Because f is a non-zero element of GF(16), f has an inverse, $f^1$. Thus the second decoding stage can be done by multiplying each of the first 128 elements of the codeword $(w_0, \ldots w_{128})$ by $f^1$. For example, $v_0$ is recovered as $w_0 f^1$.

The encoding of the information bits and the first two overhead bits as the codeword $(v_0 f, \ldots, v_{127} f, f)$ is only for the purpose of being able to use the overprogrammed cells to store data correctly. Conventional error correction code (ECC) encoding is done by encoding the 512 information bits as a systematic codeword whose redundancy bits are included among the overhead bits. As noted above, this ECC encoding compensates for the possibility of some of the coordinates $v_i$, and also f, being read incorrectly e.g. because of threshold voltage drift over time. This ECC encoding also enables correct decoding of the codeword in the case that more than t cells are overprogrammed (as long as not too many more than t cells are overprogrammed), provided this ECC is performed, with knowledge of the information bits, as though the overprogrammed cells not accounted for by f had not been overprogrammed. The hard constraint encoding takes care of t of the overprogrammed cells and the subsequent ECC encoding takes care of the remaining overprogrammed cells.

Note that overprogramming of only one cell can be dealt with by simply inverting all the information bits of the lower page and using one of the overhead bits of the lower page to indicate that the information bits have been inverted. $GF(2^{t+1})$ encoding is needed, in general, for the case of two or more cells being overprogrammed.

The programming of the first logical page is an attempt to set the threshold voltages of the programmed cells so that the threshold voltages of the cells represent the most significant information bits in accordance with a default mapping, of bits to threshold voltages, that is defined e.g. by the table presented above in connection with FIG. 1B. If that attempt results in one or more cells being overprogrammed, so that the threshold voltage states desired for those cells are not accessible from the threshold voltage states actually obtained, the second logical page is encoded as the codeword ($v_0 f$, $v_1 f$, ..., $v_{127} f$, f) that, together with the table presented above in connection with FIG. 1B, constitutes an adaptive mapping of the bits of the second logical page to threshold voltages.

In the case of "soft" feedback, a more ambitious goal is set. The proposed scheme not only tries to efficiently handle errors which occur during programming (i.e. with minimal redundancy), but also tries to make the probability distribution of the cells' threshold voltages narrower. I.e. the scheme tries to induce a reduced variance in the programmed threshold voltages of all the cells which are programmed to the same state. The purpose of this is to reduce the probability that errors will be introduced after programming, e.g. due to threshold voltage drift over time. This in turn increases the reliability of the memory and allows it to endure more program and erase cycles and to exhibit increased data retention. In order to achieve this cell threshold voltage distribution narrowing, a metric is associated with each read cell indicating how important it is for the cell to be programmed to a higher "odd" state according to the degree of its overshoot from the center of its threshold voltage band. (In the two-bit-per-cell MBC example of FIG. 1B, the issue that arises is whether to promote a cell that is towards the top of state 2, or already overprogrammed into state 3, from state 2 to state 3. In the general n-bit-per-cell MBC case, there are $2^n$ states, conventionally numbered 0 through $2^n-1$, and the issue that arises is whether to promote a cell that is in an even state greater than 0 to the next odd state up.) As the overshoot increases, the distance to the threshold that distinguishes the even state from the next odd state up decreases, and the importance or desirability of placing the cell in the odd state increases. Obviously, if the overshoot is so strong as to actually place the cell in the next odd state up, as in the "hard" feedback example, the need to treat the cell as being in an odd state becomes absolute. I.e. in this case if the cell's data is not "re-mapped" such that it is placed in the next state, then this cell will be in error and will become an additional burden on the ECC (allowing fewer cell errors occurring after programming to be handled).

The second example is such a "soft" constraint example in which an encoding is chosen from a set of multiple encodings with a number of "soft" constraints on the codeword. By "soft" constraints is meant that for some bits it is more desired that they will be "0", hence they are set to have a high probability of being "0" bits (and a low but non-zero probability of being "1" bits) while for other bits it is more desired that they will be "1", hence they are set to have lower probabilities of being "0" bits in the codeword that is chosen from among the multiple options. The preferred measure of probability of a bit v being 0 or 1 is the Log-Likelihood Ratio (LLR):

$$\log \frac{Pr(v = 0 \mid \text{current constraints and observations})}{Pr(v = 1 \mid \text{current constraints and observations})}$$

For a given information vector I, the set of multiple encodings is the set of all vectors C satisfying a matrix equation of the form HC=I, where H is a parity-check matrix that defines the code.

One preferred approach for encoding the information vector as a codeword satisfying the soft constraints is to use an iterative encoding algorithm. This can be done by using an iterative message passing algorithm such as Belief Propagation (BP), applied to the bipartite graph representation of the matrix H. Such algorithms perform well when operating on a sparse matrix H.

An equivalent bi-partite graph representation of the matrix H is derived in the following way:

Construct a bipartite graph with N left nodes (referred to as bit nodes) and K right nodes (referred to as check nodes). The bit nodes correspond to columns of H and the check nodes correspond to rows of H.

For any pair (i, j) such that $H_{ij}=1$ draw an edge from bit-node j to check-node i.

The bit nodes are associated, with bits in the codeword C. The check nodes are associated with bits in the information vector I.

The check nodes impose constraints on their connected bit nodes (or associated codeword bits). If the corresponding information bit associated with the check node is "0" then the check node imposes the constraint that its connected codeword bits (or bit nodes) should include an even number of "1"s. If the corresponding information bit associated with the check node is "1" then the check node imposes the constraint that its connected codeword bits (or bit nodes) should include an odd number of "1"s.

Returning now to the drawings, FIG. 2 shows (on the left) a sparse parity-check matrix H that defines a code and (on the right) the equivalent sparse bipartite graph G=(V,C,E) with a set V of N bit nodes (N=13 in the example), a set C of K check nodes (K=10 in the example) and a set E (E=38 in the example) of edges connecting bit nodes to check nodes. The bit nodes correspond to the codeword bits and the check nodes correspond to parity-check constraints on the bits. A bit node is connected by edges to the check nodes it participates in.

Based on the graphical representation of the code, encoding can be performed using iterative message passing algorithms. These algorithms operate by exchanging messages between bit nodes and check nodes over the edges of the underlying bipartite graph representing the code. The encoder is provided with initial estimates of the codeword bits (based on the "soft" feedback from the read memory cells). These initial estimates are refined and improved by imposing the check node constraints that the bits should satisfy as a valid codeword. This is done by exchanging information between the bit nodes representing the codeword bits and the check nodes representing the constraints on the codeword bits, using the messages that are passed along the graph edges.

The bit estimates are the LLRs defined above. The "current constraints and observations" are the various check node constraints taken into account in computing the message at hand and the initial estimates corresponding to the codeword bits that participate at these check nodes.

The iterative message passing algorithm begins from an initial vector of "LLRs" associated with coordinates of C. For example, if we have no a priori preferences for the values of C, we can set all the initial LLRs to 0 ("don't care"). If it is preferred that a codeword bit be "0", as in the overprogramming case, the corresponding LLR is set to a positive number, preferably between 20 and 32. If it is preferred that a codeword bit to be "1", as in the case discussed in the Field and Background section of a cell that is stuck in its erased state and cannot be programmed at all, the corresponding LLR is set to a negative number, preferably between −20 and −32. The absolute value of the LLR reflects the strength of the tendency towards "0" or "1". For example, if it is desired to force t coordinates of C to be 0, these coordinates are set to a very high positive LLR value.

This code can be combined with a conventional ECC, by adding additional parity-check constraints that the codeword C should satisfy. This can be done by constructing a parity-check matrix $H_T$, composed of both the matrix H and an additional matrix $H_{ECC}$ (that contains the additional parity-checks on C). A valid codeword C then satisfies the following set of equations:

$$H_T C = \begin{bmatrix} H \\ H_{ECC} \end{bmatrix} C = \begin{bmatrix} I \\ 0 \end{bmatrix}$$

Denoting the vector of LLRs to which C is initialized as "P", the message passing rules are as follows:

Bit Node to Check Node Messages:

$$Q_{vc} = P_v + \sum_{c' \in N(v,G) \setminus c} R_{c'v}$$

Check Node to Bit Node Messages:
For a check node corresponding to a "0" bit of I or to one of the conventional ECC parity checks:

$$R_{cv} = \varphi^{-1}\left(\sum_{v' \in N(c,G) \setminus v} \varphi(Q_{v'c})\right)$$

For a check node corresponding to a "1" bit of I:

$$R_{cv} = \varphi^{-1}\left(\sum_{v' \in N(c,G) \setminus v} \varphi(Q_{v'c})\right)$$

In these message passing rules, $N(n,G)$ denotes the neighbors of node n in the graph $$G, \varphi(x) = \left\{\text{sign}(x), -\log\tanh\left(\frac{|x|}{2}\right)\right\}$$

and the operations in the φ domain are summation over magnitude and XOR over sign. All the $R_{cv}$'s initialized to zero, so that in the first iteration $Q_{vc} = P_v$.

At the end of each iteration, the estimate of the LLRs of the codeword elements is $$Q_v = P_v + \sum_{c \in N(v,G)} R_{cv}$$

and the bit $C_v$ is "0" if $Q_v > 0$ and "1" if $Q_v < 0$. If that vector C satisfies HC=I then the iterations have converged. Otherwise, the iterations are continued.

In general, this iterative message passing may not converge. To force convergence, the lower triangular matrix structure illustrated in FIG. 3 is used.

Figure 3:
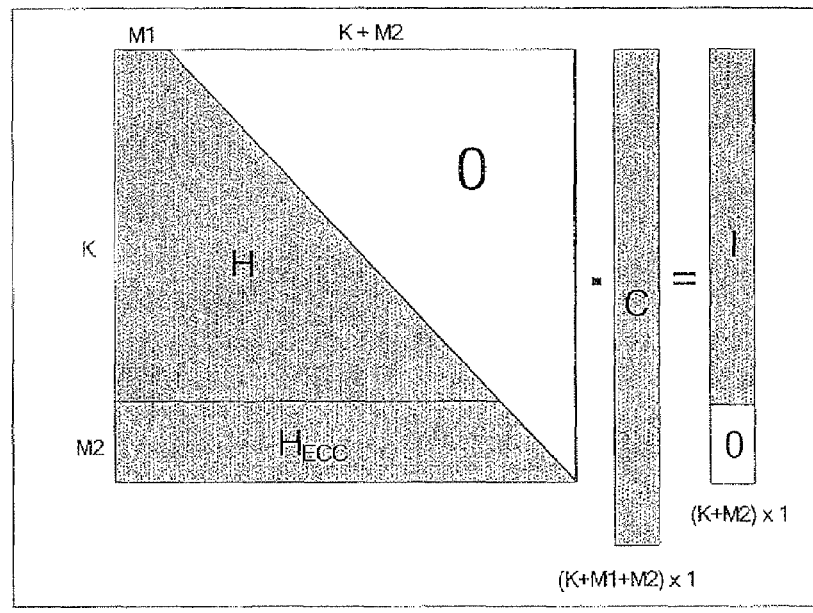
FIG. 3 shows the lower triangular structure used to force the "soft" encoding to converge.

The terminology used in FIG. 3 is as follows:
K—number of information bits.
$M_1$—number of redundancy bits added for allowing multiple codeword representations for every information vector (there are $2^{M_1}$ possible vectors C associated with each information vector I).
$M_2$—number of redundancy bits for conventional FCC.
The following is a K=4, $M_1$=2, $M_2$=0 example.

$$H = \begin{pmatrix} 1 & 1 & 1 & 0 & 0 & 0 \\ 1 & 0 & 1 & 1 & 0 & 0 \\ 1 & 1 & 0 & 1 & 1 & 0 \\ 0 & 0 & 1 & 1 & 0 & 1 \end{pmatrix}, I = \begin{pmatrix} 1 \\ 0 \\ 1 \\ 0 \end{pmatrix}$$

Assuming $C=(c_1, c_2, c_3, c_4, c_5, c_6)^T$ the general solution of HC=I is found by choosing $c_1$ and $c_2$ as parameters and expressing the other four elements of C as $c_3 = c_1 + c_2 + I_1$ $c_4 = c_2 + I_1 + I_2$ $c_5 = c_1 + I_1 + I_2 + I_3$ $c_6 = c_1 + I_2 + I_4$ One solution (default) is to choose $c_1 = c_2 = 0$ so that $c_3 = I_1 = 1$ $c_4 = I_1 + I_2 = 1$ $c_5 = I_1 + I_2 + I_3 = 0$ $c_6 = I_2 + I_4 = 0$ If overprogramming requires $c_3 = 0$, choose $c_1 = 0$ and $c_2 = 1$, so that $c_3 = c_2 + I_1 = 0$ $c_2 + I_1 + I_2 = 0$ $c_5 = I_1 + I_2 + I_3 = 0$ $c_6 = I_2 + I_4 = 0$ Alternatively, setting $c_1 = 1$ and $c_2 = 0$ gives $c_3 = c_1 + I_1 = 0$ $c_4 = I_1 + I_2 = 1$ $c_5 = c_1 + I_1 + I_2 + I_3 = 1$ $c_6 = c_1 + I_2 + I_4 = 1$ The matrix structure of FIG. 3 can guarantee that the iterative encoder always converges to a valid solution for C. This is done by performing an initial encoding operation, and in case the encoding did not converge (i.e. a codeword satisfying all the checks was not found), the first $M_1$ bits of C are modified in such a way that strengthens the "trend" of these bits, i.e. negative values of the first $M_1$ bits (negative LLRs and so tend to "1") are given higher probabilities of being 1 (larger negative values), and positive values of the first $M_1$ bits (positive LLRs and so tend to 0" are given higher probabilities of being 0 (large positive values). The encoding then is repeated.

This strategy guarantees that the encoding converges, since for specific values of the first $M_1$ bits there is a (unique) solution to the set of equations. From FIG. 3 it is clear that once the first $M_1$ bits are set then using Gaussian elimination in the next $K+M_2$ equations adds one more bit whose value is defined by the corresponding matrix row (equation). For example, if $M_1=2$, $K=3$ and $M_2=0$ if the first two bits $c_1, c_2$ are 0 and 1, respectively, if $I(2)=1$ and if the second row of the matrix is (1 1 1) then $c_1 \oplus c_2 \oplus c_3 = 1 \oplus 1 \oplus c_3$ so that $c_3=1$, Initially, the first $M_1$ bits are unbiased (LLR=0) in order to not enforce a solution. In practice, the iterative procedure is limited to a small number of iterations and the LLRs associated with the first $M_1$ bits are set and then the encoding continues with Gaussian elimination for the next $K+M_2-1$ steps. In each such step the single next bit of C is computed.

When the codeword is read back from the flash memory, conventional ECC, based on the matrix $H_{ECC}$, is used to recover the first $M_1+K$ bits of C, and those bits are multiplied by H to recover the information vector I.

Alternatively, a bipartite graph associated with the equation HC=I, where H is a K×N matrix, is constructed as follows:

Construct a bipartite graph with N+1 left nodes (referred to as bit nodes) and K right nodes (referred to as check nodes).

The first N bit nodes correspond to columns of H, while the last bit node is a "dummy" bit-node; the check nodes correspond to rows of H.

For any pair (i, j) such that $H_{ij}=1$ draw an edge from bit-node j to check-node i.

For any row i such that $I_i=1$ draw an edge from bit-node N+1 to check-node i.

The first N bit nodes are associated with bits in the codeword C.

The last bit-node is a "dummy" bit-node associated with the constant value of "1".

The check nodes impose constraints on their connected bit nodes (or associated codeword bits). The constraint is that for each check node, its connected codeword bits (or bit nodes) should include an even number of "1"s (including the "dummy" bit-node).

Note that this alternative is equivalent to applying conventional decoding message passing rules to solve the following matrix equation:

$$[H\ I]\begin{bmatrix}C\\1\end{bmatrix}=0$$

except that the dummy bit node is fixed at a "1" value so that the rule for the bit node to check node messages from the dummy bit node is $Q_{K+M_1+1,c}=1$.

Figure 4:
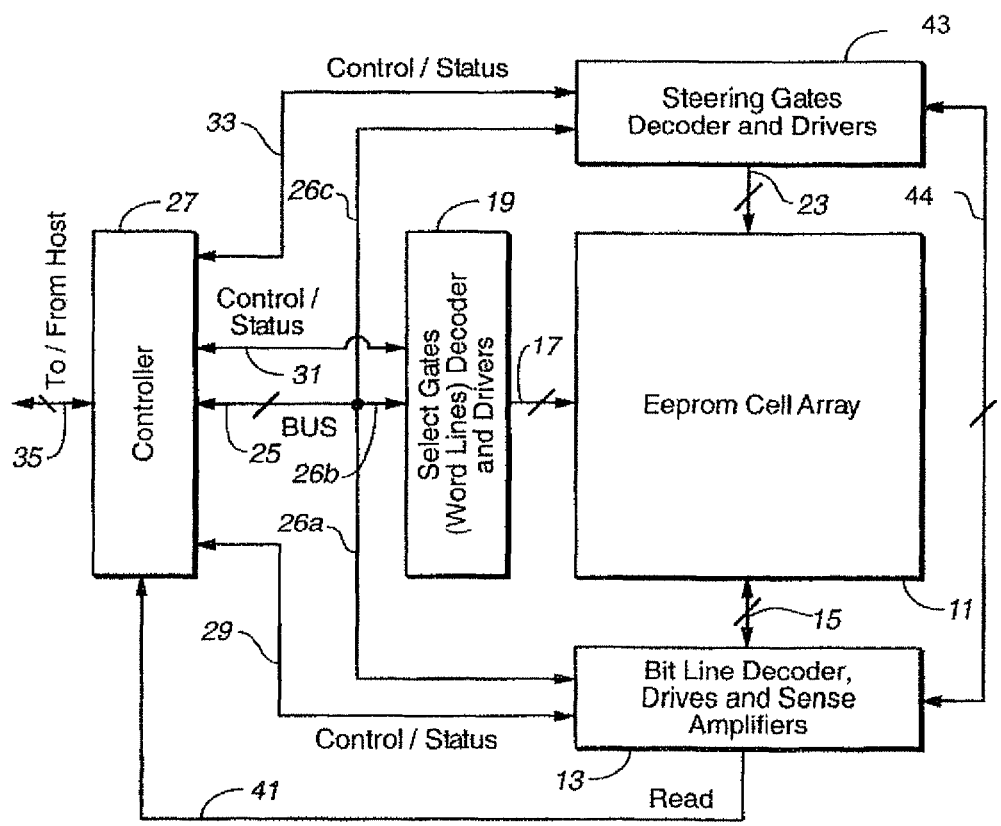
FIG. 4 is a high-level schematic block diagram of a flash memory device.

FIG. 4 is a high-level schematic block diagram of a flash memory device. A large number of individually addressable memory cells are arranged in a regular array 11 of rows and columns. Individual memory cells can be controlled by bit lines, select gates arranged in word lines, and steering gates. Bit lines are designated herein to extend along columns of array 11, and word lines are designated to extend along the rows of array H. Bit line unit 13 may include a bit line decoder, storage elements, driver circuits and sense amplifiers. Bit line unit 13 can be coupled to cell array 11 by line 15, and to controller 27 by bit-control line 29 and by read line 41. Word line unit 19 may include a select gate decoder and driver circuits. Word line unit 19 can be coupled to cell array 11 by line 17, and to controller 27 by word-control line 31. Steering line unit 43 may include a steering gate decoder and driver circuits. Steering unit 43 can be coupled to cell array 11 by line 23, to controller 27 by steering-control line 33, and to bit line unit 13 by line 44. Bit line unit 13, word line unit 19 and steering unit 43 can be coupled to bus 25, which in turn is coupled to controller 27. Controller 27 can be coupled to the host by line 35.

When a pre-selected memory cell is to be programmed, voltages can be applied to the bit lines, word line and steering gates, corresponding to the pre-selected memory cell, at predetermined levels sufficient for the programming of the pre-selected cell. Controller 27 sends the address of the pre-selected memory cell through bus 25 to the respective decoders in bit line unit 13, word line unit 19, and steering gate unit 43 through lines 26a, 26b, and 26c, respectively. Status and control commands between bit line unit 13, word line unit 19, steering gate unit 43 and controller 27 are communicated through bit-control line 29, word-control line 31 and steering control line 33.

When a pre-selected memory cell is to be read, voltages can be applied to the corresponding bit lines, word line and steering gates, corresponding to the pre-selected memory cell, at predetermined levels, sufficient to enable the reading of the pre-selected memory cell. Controller 27 is capable of applying the voltages of the bit lines through bit-control line 29, applying the voltages of the word lines through word-control line 31 and applying the voltages of steering gates through steering control line 33. A current can be generated through the pre-selected memory cell by these voltages. The current is indicative of whether the pre-selected memory cell was programmed or not (in the case of the cells of array 11 having been programmed one bit per cell) or of the bit pattern that has been stored in the pre-selected memory cell (in the case of the cells of array 11 having been programmed with more than one bit per cell). The value of the current can be amplified and compared against references by sense amplifiers in bit line unit 13, the result of which can be temporarily stored in latches or registers. The resultant data, read out from the pre-selected memory cell, can be sent to controller 27 through read line 41.

When writing information bits to memory cell array 1, controller 27 determines whether the encoding methodology described above is needed to overcome the programming problems described above: temporary problems such as over-programmed cells, or permanent problems such as cells that cannot be programmed because they are frozen in their erase states (minimum threshold voltages) or in high threshold voltage states. If the encoding methodology described above is needed to program the information bits, then controller 27 encodes the information bits as described above and stores the resulting codeword in memory cell array 1. When reading data stored in memory cell array 1, if controller 27 recognizes the read data as such a codeword, then controller 27 recovers the information bits from the codeword as described above.

Figure 5:
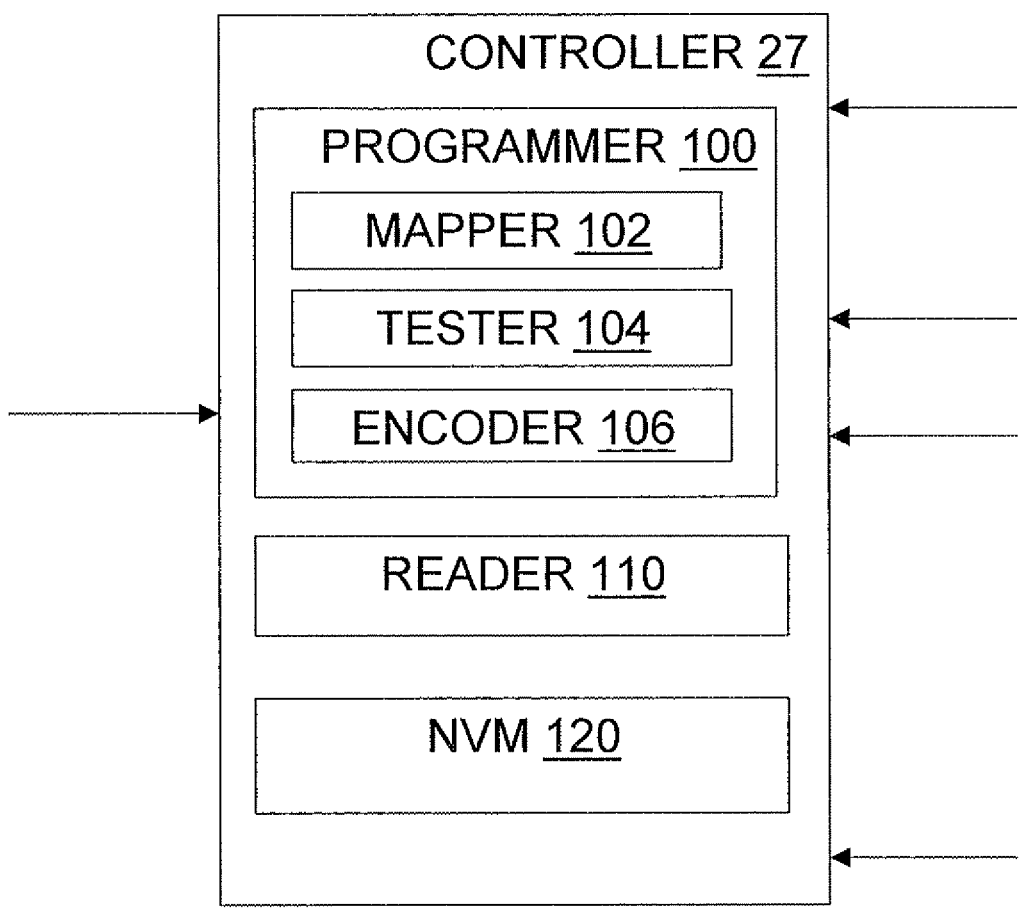
FIG. 5 is a partial functional block diagram of the controller of FIG. 4.

FIG. 5 is a partial functional block diagram of controller 27, showing that the functional blocks of controller 27 include a programming block 100 for programming cell array 11 and a reading block 110 for reading cell array 11. Programming block 100 in turn includes a threshold voltage mapping sub-block 102, a testing sub-block 104 and an encoding sub-block 106. Threshold voltage mapping sub-block 102 maps bits to be programmed into threshold voltage intervals, for example, in the two-bit-per-cell case, according to the table presented above in connection with FIG. 1B. Testing sub-block 104 reads the cells that were programmed according to the threshold voltage mapping provided by threshold voltage mapping sub-block 102 to determine whether that programming succeeded. If that programming failed, e.g. because one or more of the programmed cells became overprogrammed during the programming of an initial portion of the bits, or if that programming is expected to fail, e.g. because one of the cells to be programmed is known to be frozen in its erase state or in its highest threshold voltage state, encoding sub-block 106 encodes some or all of the bits as a codeword, as described above, whose bits are mapped to accessible threshold voltage intervals by threshold voltage mapping sub-block 102. Optionally, controller 27 also includes a small non-volatile memory 120 for storing identities of which cells of cell array 11 are defective. (Otherwise, defective cells are identified by the manner in which those cells fail to be programmed correctly.) The functional blocks and the functional sub-blocks of controller 27 may be implemented in hardware, in firmware, or as combinations of hardware and/or firmware and/or software.

FIG. 6 is a high-level block diagram of a system 50 of the present invention. System 50 includes a processor 52 and four memory devices: a RAM 54, a boot ROM 56, a mass storage device (hard disk) 58 and a prior art flash memory device 64, all communicating via a common bus 66. Flash memory device 64 could include, for example, the components of the flash memory device of FIG. 4 other than controller 27, as system 50 emulates the functionality of controller 27 by executing software. A software driver 60 of flash memory device 64 is stored in mass storage device 58 and is executed by processor 52 to access flash memory device 64. Driver 60 includes a module 62 for encoding data to be stored in flash memory device 64, and for decoding codewords received from flash memory device 64, using the methodology described herein.

In FIG. 6, the components of system 50 other than flash memory device 64 constitute a host 70 of flash memory device 64. Mass storage device 58 is an example of a computer-readable storage medium bearing computer-readable code for implementing the data storage methodology described herein. Other examples of such computer-readable storage media include read-only memories such as CDs bearing such code.

A limited number of embodiments of methods for storing data in a memory such as a flash memory, and of a device and system that use the methods, have been described. It will be appreciated that many variations, modifications and other applications of the methods, device and system may be made.

What is claimed is:

1. A method of storing a plurality of bits, comprising:
   (a) attempting to set a respective value of a physical parameter of each of at least one memory cell so that the at least one value of the physical parameter of the at least one memory cell represents an initial portion of the bits;
   (b) providing, in accordance with the at least one value to which the physical parameter of the at least one cell has been set, an adaptive mapping of the bits to physical parameter value ranges for storing all of the bits in the at least one memory cell; and
   (c) for each of the at least one memory cell, if, according to the adaptive mapping, the respective value of the physical parameter of the each memory cell needs to be adjusted in order for all of the bits to be stored in the at least one memory cell: adjusting the respective value of the physical parameter of the each memory cell in accordance with the adaptive mapping.

2. The method of claim 1, wherein the attempting step also attempts to set the respective value of the physical parameter of each memory cell so that the at least one value, of the physical parameter of the at least one memory cell, that corresponds to all the bits, is accessible from the at least one value, of the physical parameter of the at least one memory cell, that is set by the attempting step.

3. The method of claim 1, wherein the physical parameter is threshold voltage.

4. The method of claim 1, further comprising:
   (d) providing a default mapping of bits to physical parameter value ranges for storing all the bits in the at least one cell.

5. The method of claim 4, wherein the adaptive mapping is identical to the default mapping.

6. The method of claim 4, wherein the adaptive mapping differs from the default mapping.

7. The method of claim 6, wherein the default mapping is inconsistent with storing all of the bits in the at least one cell.

8. The method of claim 7, wherein, for one of the at least one cell, the physical parameter value range, of the one cell, that corresponds to a respective at least some of the bits according to the default mapping, is inaccessible, from the respective value to which the physical parameter of the one cell has been set for storing the initial portion of the bits.

9. The method of claim 8, wherein the physical parameter value ranges are ordered, and wherein the physical parameter value range, of the one cell, that corresponds to the respective at least some of the bits, is lower than the respective value to which the physical parameter of the one cell has been set for storing the initial portion of the bits.

10. The method of claim 1, wherein the providing of the adaptive mapping includes encoding at least a portion of the bits as a codeword.

11. The method of claim 10, wherein the adjusting of the respective value of the physical parameter of the each cell includes adjusting the respective value of the physical parameter of the each cell so that the cell stores a respective at least portion of the codeword.

12. A method of storing at least one bit, comprising:
   (a) providing a default mapping of the at least one bit to a predetermined set of ranges of values of a physical parameter of at least one memory cell;
   (b) attempting to set a respective value of the physical parameter of each memory cell of the at least one memory cell so that the at least one bit is stored in the at least one memory cell in accordance with the default mapping; and
   (c) if the attempting sets the respective value of the physical parameter of one of the at least one memory cell to a value from which a range of physical parameter values, of the one memory cell, that corresponds to the at least one bit according to the default mapping, is inaccessible: providing an adaptive mapping, of the at least one bit to the predetermined set of ranges of the values of the physical parameter, for storing the at least one bit in the at least one memory cell, such that the range of physical parameter values of the one memory cell that corresponds to the at least one bit according to the adaptive mapping is accessible.

13. The method of claim 12, further comprising:
(d) setting the respective value of the physical parameter of each memory cell so that the at least one bit is stored in the at least one memory cell in accordance with the adaptive mapping.

14. The method of claim 12, wherein the physical parameter is threshold voltage.

15. The method of claim 12, wherein the physical parameter value ranges are ordered, and wherein the physical parameter value range, of the one cell, that corresponds to the at least one bit according to the default mapping, is lower than the respective value to which the attempting has set the physical parameter of the one cell.

16. The method of claim 12, wherein the providing of the adaptive mapping includes encoding at least a portion of the at least one bit as a codeword.

17. A method of storing at least one bit, comprising:
(a) providing a plurality of mappings of the at least one bit to a predetermined set of ranges of values of a physical parameter of at least one memory cell;
(b) attempting to set a respective value of the physical parameter of each memory cell of the at least one memory cell so that the at least one bit is stored in the at least one memory cell in accordance with a first one of the mappings, wherein the attempting sets the respective value of the physical parameter of one of the at least one memory cell to a value from which a range of physical parameter values, of the one cell, that corresponds to the at least one bit according to the first mapping, is inaccessible; and
(c) responsive to an outcome of the attempting: selecting a different one of the mappings to actually use for storing the at least one bit in the at least one memory cell.

18. The method of claim 17, further comprising:
(d) setting the respective value of the physical parameter of each memory cell so that the at least one bit is stored in the at least one memory cell in accordance with the one mapping.

19. The method of claim 17, wherein the physical parameter is threshold voltage.

20. The method of claim 18, wherein the physical parameter value ranges are ordered, and wherein the physical parameter value range of the one cell, that corresponds to the at least one bit according to the first mapping, is lower than the respective value to which the attempting has set the physical parameter of the one cell.

21. The method of claim 17 wherein the one mapping includes an encoding of at least a portion of the at least one bit as a codeword.

22. A controller, for storing a plurality of bits in a memory that includes at least one memory cell, the controller being operative:
(a) to attempt to set a respective value of a physical parameter of each of the at least one memory cell so that the at least one value of the physical parameter of the at least one memory cell represents an initial portion of the bits;
(b) to provide, in accordance with the at least one value to which the physical parameter of the at least one cell has been set, an adaptive mapping of the bits to physical parameter value ranges for storing all of the bits in the at least one memory cell; and
(c) for each of the at least one memory cell: to adjust the respective value of the physical parameter of the each memory cell in accordance with the adaptive mapping if, according to the adaptive mapping, the respective value of the physical parameter of the each memory cell needs to be adjusted in order for all the bits to be stored in the at least one memory cell.

23. A controller, for storing at least one bit in a memory that includes at least one memory cell, the controller being operative:
(a) to attempt to set a respective value of a physical parameter of each memory cell of the at least one memory cell so that the at least one bit is stored in the at least one memory cell in accordance with a default mapping of the at least one bit to a predetermined set of ranges of values of the physical parameter; and
(b) if the attempting sets the respective value of the physical parameter of one of the at least one memory cell to a value from which a range of physical parameter values, of the one memory cell, that corresponds to the at least one bit according to the default mapping, is inaccessible: to provide an adaptive mapping, of the at least one bit to the predetermined set of ranges of the values of the physical parameter, for storing the at least one bit in the at least one memory cell, such that the range of physical parameter values of the one memory cell that corresponds to the at least one bit according to the adaptive mapping is accessible.

24. A controller, for storing at least one bit in a memory that includes at least one memory cell, the controller being operative:
(a) to provide a plurality of mappings of the at least one bit to a predetermined set of ranges of values of a physical parameter of the at least one memory cell;
(b) to attempt to set a respective value of the physical parameter of each memory cell of the at least one memory cell so that the at least one bit is stored in the at least one memory cell in accordance with a first one of the mappings, wherein the attempting sets the respective value of the physical parameter of one of the at least one memory cell to a value from which a range of physical parameter values, of the one cell, that corresponds to the at least one bit according to the first mapping, is inaccessible; and
(c) responsive to the outcome of the attempting: to select a different one of the mappings to actually use for storing the at least one bit in the at least one memory cell.

25. A memory device comprising:
(a) a memory including at least one memory cell; and
(b) a controller operative:
(i) to attempt to set a respective value of a physical parameter of each of the at least one memory cell so that the at least one value of the physical parameter of the at least one memory cell represents an initial portion of a plurality of bits,
(ii) to provide, in accordance with the at least one value to which the physical parameter of the at least one cell has been set, an adaptive mapping of the bits to physical parameter value ranges for storing all of the bits in the at least one memory cell, and
(iii) for each of the at least one memory cell: to adjust the respective value of the physical parameter of the each memory cell in accordance with the adaptive mapping if, according to the adaptive mapping, the respective value of the physical parameter of the each memory cell needs to be adjusted in order for all the bits to be stored in the at least one memory cell.

26. A memory device comprising:
(a) a memory including at least one memory cell; and
(b) a controller operative:

(i) to attempt to set a respective value of a physical parameter of each memory cell of the at least one memory cell so that the at least one bit is stored in the at least one memory cell in accordance with a default mapping of the at least one bit to a predetermined set of ranges of values of the physical parameter, and (ii) if the attempting sets the respective value of the physical parameter of one of the at least one memory cell to a value from which a range of physical parameter values, of the one memory cell, that corresponds to the at least one bit according to the default mapping, is inaccessible: to provide an adaptive mapping, of the at least one bit to the predetermined set of ranges of the values of the physical parameter, for storing the at least one bit in the at least one memory cell, such that the range of physical parameter values of the one memory cell that corresponds to the at least one bit according to the adaptive mapping is accessible.

27. A memory device comprising:
(a) a memory including at least one memory cell; and
(b) a controller operative:
   (i) to provide a plurality of mappings of at least one bit to a predetermined set of ranges of values of a physical parameter of the at least one memory cell,
   (ii) to attempt to set a respective value of the physical parameter of each memory cell of the at least one memory cell so that the at least one bit is stored in the at least one memory cell in accordance with a first one of the mappings, wherein the attempting sets the respective value of the physical parameter of one of the at least one memory cell to a value from which a range of physical parameter values, of the one cell, that corresponds to the at least one bit according to the first mapping, is inaccessible, and
   (iii) responsive to the outcome of the attempting: to select a different one of the mappings to actually use for storing the at least one bit in the at least one memory cell.

28. A system comprising:
(a) a first memory, including at least one memory cell, for storing a plurality of bits; and
(b) a host, of the first memory, including:
   (i) a second memory for storing code for managing the first memory by:
      (A) attempting to set a respective value of a physical parameter of each of the at least one memory cell so that the at least one value of the physical parameter of the at least one memory cell represents an initial portion of the bits,
      (B) providing, in accordance with the at least one value to which the physical parameter of the at least one cell has been set, an adaptive mapping of the bits to physical parameter value ranges for storing all of the bits in the at least one memory cell, and
      (C) for each of the at least one memory cell, if, according to the adaptive mapping, the respective value of the physical parameter of the each memory cell needs to be adjusted in order for all of the bits to be stored in the at least one memory cell: adjusting the respective value of the physical parameter of the each memory cell in accordance with the adaptive mapping, and
   (ii) a processor for executing the code.

29. A system comprising:
(a) a first memory, including at least one memory cell, for storing at least one bit; and
(b) a host, of the first memory, including:
   (i) a second memory for storing code for managing the first memory by:
      (A) providing a default mapping of the at least one bit to a predetermined set of ranges of values of a physical parameter of the at least one memory cell,
      (B) attempting to set a respective value of the physical parameter of each memory cell of the at least one memory cell so that the at least one bit is stored in the at least one memory cell in accordance with the default mapping, and
      (C) if the attempting sets the respective value of the physical parameter of one of the at least one memory cell to a value from which a range of physical parameter values, of the one memory cell, that corresponds to the at least one bit according to the default mapping, is inaccessible: providing an adaptive mapping, of the at least one bit to the predetermined set of ranges of the values of the physical parameter, for storing the at least one bit in the at least one memory cell, such that the range of physical parameter values of the one memory cell that corresponds to the at least one bit according to the adaptive mapping is accessible, and
   (ii) a processor for executing the code.

30. A system comprising:
(a) a first memory, including at least one memory cell, for storing at least one bit; and
(b) a host, of the first memory, including:
   (i) a second memory for storing code for managing the first memory by:
      (A) providing a plurality of mappings of the at least one bit to a predetermined set of ranges of values of a physical parameter of the at least one memory cell,
      (B) attempting to set a respective value of the physical parameter of each memory cell of the at least one memory cell so that the at least one bit is stored in the at least one memory cell in accordance with a first one of the mappings, wherein the attempting sets the respective value of the physical parameter of one of the at least one memory cell to a value from which a range of physical parameter values, of the one cell, that corresponds to the at least one bit according to the first mapping, is inaccessible, and
      (C) responsive to an outcome of the attempting: selecting a different one of the mappings to actually use for storing the at least one bit in the at least one memory cell, and
   (ii) a processor for executing the code.

31. A computer-readable storage medium having embedded thereon computer-readable code for storing a plurality of bits in a memory that includes at least one memory cell, the computer-readable code comprising:
(a) program code for attempting to set a respective value of a physical parameter of each of the at least one memory cell so that the at least one value of the physical parameter of the at least one memory cell represents an initial portion of the bits;
(b) program code for providing, in accordance with the at least one value to which the physical parameter of the at least one cell has been set, an adaptive mapping of the bits to physical parameter value ranges for storing all of the bits in the at least one memory cell; and
(c) program code for: for each of the at least one memory cell, if according to the adaptive mapping, the respective value of the physical parameter of the each memory cell needs to be adjusted in order for all of the bits to be stored in the at least one memory cell: adjusting the respective value of the physical parameter of the each memory cell in accordance with the adaptive mapping.

32. A computer-readable storage medium having embedded thereon computer-readable code for storing at least one bit in a memory that includes at least one memory cell, the computer-readable code comprising:
(a) program code for providing a default mapping of the at least one bit to a predetermined set of ranges of values of a physical parameter of the at least one memory cell;
(b) program code for attempting to set a respective value of the physical parameter of each memory cell of the at least one memory cell so that the at least one bit is stored in the at least one memory cell in accordance with the default mapping; and
(c) program code for: if the attempting sets the respective value of the physical parameter of one of the at least one memory cell to a value from which a range of physical parameter values, of the one memory cell, that corresponds to the at least one bit according to the default mapping, is inaccessible: providing an adaptive mapping, of the at least one bit to the predetermined set of ranges of the values of the physical parameter, for storing the at least one bit in the at least one memory cell, such that the range of physical parameter values of the one memory cell that corresponds to the at least one bit according to the adaptive mapping is accessible.

33. A computer-readable storage medium having embedded thereon computer-readable code for storing at least one bit in a memory that includes at least one memory cell, the computer-readable code comprising:
(a) program code for providing a plurality of mappings of the at least one bit to a predetermined set of ranges of values of a physical parameter of the at least one memory cell;
(b) program code for attempting to set a respective value of the physical parameter of each memory cell of the at least one memory cell so that the at least one bit is stored in the at least one memory cell in accordance with a first one of the mappings, wherein the attempting sets the respective value of the physical parameter of one of the at least one memory cell to a value from which a range of physical parameter values, of the one cell, that corresponds to the at least one bit according to the first mapping, is inaccessible; and
(c) program code for: responsive to an outcome of the attempting: selecting a different one of the mappings to actually use for storing the at least one bit in the at least one memory cell.

* * * * *